(12) United States Patent
Noltemeyer et al.

(10) Patent No.: US 12,710,619 B2
(45) Date of Patent: Aug. 18, 2026

(54) MICROELECTROMECHANICAL APPARATUS WITH HEATING ELEMENT

(71) Applicants: Robert Bosch GmbH, Stuttgart (DE); Carl Zeiss SMT GmbH, Oberkochen (DE)

(72) Inventors: Ralf Noltemeyer, Herrenberg (DE); Arnd Kaelberer, Schlierbach (DE)

(73) Assignees: Robert Bosch GmbH, Stuttgart (DE); Carl Zeiss SMT GmbH, Oberkochen (DE)

( * ) Notice: Subject to any disclaimer, the term of this patent is extended or adjusted under 35 U.S.C. 154(b) by 320 days.

(21) Appl. No.: 18/460,748

(22) Filed: Sep. 5, 2023

(65) Prior Publication Data

US 2024/0085661 A1 Mar. 14, 2024

(30) Foreign Application Priority Data

Sep. 9, 2022 (DE) ......................... 102022209413.1

(51) Int. Cl.
*G02B 7/18* (2021.01)
*G02B 26/08* (2006.01)
*G03F 7/00* (2006.01)

(52) U.S. Cl.
CPC ....... *G02B 7/1815* (2013.01); *G02B 26/0833* (2013.01); *G03F 7/702* (2013.01); *G03F 7/70891* (2013.01)

(58) Field of Classification Search
CPC .............. G02B 26/0833; G02B 27/017; G02B 7/1815; G03F 7/702; G03F 7/70891;
(Continued)

(56) References Cited

U.S. PATENT DOCUMENTS 8,894,225 B2 * 11/2014 Hauf .................. G03F 7/70891 359/845
9,195,150 B2 * 11/2015 Cadee ................ G03F 7/70708
(Continued)

FOREIGN PATENT DOCUMENTS

DE 10 2006 059 091 A1 7/2007
DE 10 2008 013 098 B4 2/2012
(Continued)

*Primary Examiner* — Deoram Persaud
(74) *Attorney, Agent, or Firm* — Dority & Manning, P.A.

(57) ABSTRACT

The invention relates to a microelectromechanical apparatus comprising one or more microelectromechanical devices each having a mirror element, an actuator for moving the respective mirror element, and a heating element for heating the respective mirror element, wherein the microelectromechanical apparatus comprises one or more temperature sensors and an electronic system, wherein the control electronic system is configured to determine a temperature value of the respective mirror element using the one or more temperature sensors for each mirror element, and the electronic system is further configured to adjust a heating power for each of the heating elements. The invention further relates to an illumination optical unit, to an illumination system and to a projection exposure apparatus, each having a microelectromechanical apparatus according to the invention, and to a method for controlling temperatures of a microelectromechanical apparatus in a closed-loop.

13 Claims, 2 Drawing Sheets

(58) Field of Classification Search
CPC ..... G03F 7/70116; B25J 13/006; B25J 13/02; B25J 13/04; B25J 13/08; B25J 15/0066; B25J 19/02; G06F 3/014; G06F 3/017; G06T 13/20; G06T 19/006; G01L 5/04; G01N 2021/8893; G01N 21/93
See application file for complete search history.

(56) References Cited

U.S. PATENT DOCUMENTS

| | | | | |
|---|---|---|---|---|
| 2002/0153362 | A1* | 10/2002 | Sandstrom | G03F 7/70558 219/121.73 |
| 2004/0125431 | A1* | 7/2004 | Mehrl | G02B 26/0841 359/290 |
| 2006/0033980 | A1 | 2/2006 | Wagner et al. | |
| 2010/0238454 | A1* | 9/2010 | Pruessner | G01N 21/75 73/580 |
| 2012/0044474 | A1* | 2/2012 | Hauf | G03F 7/70291 359/872 |
| 2014/0327895 | A1* | 11/2014 | Waldis | G03F 7/70291 359/849 |
| 2018/0107122 | A1* | 4/2018 | Dinger | G03F 7/70575 |
| 2022/0252862 | A1* | 8/2022 | Hamann | G03F 7/70291 |
| 2022/0342199 | A1* | 10/2022 | Halbach | G02B 26/085 |
| 2024/0176249 | A1* | 5/2024 | Nefzi | G03F 7/70316 |

FOREIGN PATENT DOCUMENTS

| | | | |
|---|---|---|---|
| DE | 10 2013 206 531 | A1 | 5/2014 |
| DE | 10 2013 208 446 | A1 | 6/2014 |
| DE | 10 2013 206 529 | A1 | 4/2015 |
| DE | 10 2015 204 874 | A1 | 9/2016 |
| DE | 10 2016 213 026 | A1 | 1/2018 |
| DE | 10 2019 205 251 | A1 | 5/2019 |
| DE | 10 2020 210 026 | A1 | 2/2022 |
| EP | 0 877 272 | A1 | 11/1998 |
| WO | WO 2010/049076 | A2 | 5/2010 |

* cited by examiner 188,190
176,184
178
180
186
174
130,138
130,134
132
135
130
146
110
120
150
160
162
145
125
140
100,172
170

MICROELECTROMECHANICAL APPARATUS WITH HEATING ELEMENT

PRIORITY CLAIM

The present application claims the benefit of priority of German Patent Application No. 102022209413.1, filed Sep. 9, 2022, which is incorporated herein by reference in its entirety.

The present invention concerns the field of micromirror arrays and relates to a microelectromechanical apparatus, to an illumination optical unit, to an illumination system for a projection exposure apparatus, to a corresponding projection exposure apparatus and to a method for controlling temperatures of a microelectromechanical apparatus in a closed-oop.

PRIOR ART

Apparatuses comprising displaceable micromirrors arranged in the manner of a matrix, known as micromirror arrays or micromirror actuators, are used nowadays in a multiplicity of apparatuses, for example in smartphones, projectors, head-up displays, barcode readers, mask exposure units in semiconductor fabrication, and microscopes. Corresponding micromirror arrays are known, for example, from documents DE 10 2013 208 446 A1, EP 0 877 272 A1 and WO 2010/049076 A2. Disclosures regarding suitable actuator devices for displacing the individual mirrors of a micromirror array, the micromirrors, are specified for example in DE 10 2013 206 529 A1, DE 10 2013 206 531 A1 and DE 10 2015 204 874 A1.

DISCLOSURE OF THE INVENTION

According to the invention, a microelectromechanical apparatus, an illumination optical unit comprising such a microelectromechanical apparatus and also an illumination system and a projection exposure apparatus, each with a corresponding illumination optical unit, and a method for controlling temperatures of a microelectromechanical apparatus in a closed-loop are proposed.

According to a first aspect of the invention, a microelectromechanical apparatus, in particular a micromirror array, comprising one or more microelectromechanical devices, each having a mirror element, an actuator for moving the respective mirror element, and a heating element for heating the respective mirror element, is proposed, wherein the microelectromechanical apparatus comprises one or more temperature sensors and an electronic system, wherein the electronic system is configured to determine a temperature value of the respective mirror element using the one or more temperature sensors for each mirror element, and the electronic system is further configured to adjust a heating power of each of the heating elements. To do this, a corresponding signal is transmitted from the electronic system to the heating element (control signal). A mirror element within the scope of this invention is an element which has a surface reflecting electromagnetic radiation of a desired wavelength range, for example EUV radiation. For example, the heating element can be an electrical resistor. A temperature value is a value or data that reflect information that correlates with a temperature. A temperature value of a mirror element therefore means a value or data that are in correlation with the temperature of the mirror element. A temperature value can be specified, for example, in ° C., i.e. be a temperature, but also in any other units, i.e., for example, a voltage value, given in the form of a binary sequence, for example. Determining a temperature value may include detecting and evaluating an individual signal from an individual temperature sensor (temperature signal) by signal evaluation, but also combining a plurality of signals from a plurality of temperature sensors by calculation. The one or more temperature sensors may be, for example, thermistors and/or semiconductor thermal sensors. The electronic system may be a decentralized electronic system, that is to say comprise in particular a first unit for determining the temperature values and a second unit for adjusting the heating powers of the heating elements, wherein the first unit and the second unit can be arranged spatially separate from each other.

According to the invention, it has been found that in particular for operation of a microelectromechanical apparatus with mirror elements such as a micromirror array in the case of applications requiring high optical precision, the temperature of the individual mirror elements is relevant, since temperature changes can lead to temperature-dependent errors due to shifts and/or deformations such as in particular elongations and/or curvatures of the mirror elements. By means of the proposed microelectromechanical apparatus, such temperature-related errors can be avoided. Both the determination of a temperature value and the control of a temperature of the mirror elements are relevant to enable an accurate and precise deflection of incident illumination radiation even at fluctuating temperatures, which may be caused, for example, by fluctuating ambient temperatures or heating of the mirror elements by absorption of parts of the illumination radiation. Temperature-related deformations of components thermally connected to the microelectromechanical devices, such as the control electronic system or a carrier substrate for carrying the microelectromechanical devices, are counteracted in this way too.

In a preferred embodiment of the microelectromechanical apparatus, each of the one or more microelectromechanical devices comprises at least one of the one or more temperature sensors. This has the advantage that more accurate temperature values can be recorded for each of the one or more microelectromechanical devices.

In particular, it may be advantageous to arrange the at least one temperature sensor of each microelectromechanical device between the respective actuator and the respective heating element. Alternatively, the respective heating element may also comprise or be identical to the at least one temperature sensor, that is to say the heating element may be a temperature sensor at the same time. This can be the case, for example, if the heating element changes an electrical resistance depending on the temperature, i.e. is implemented as a thermistor, for example. Such arrangements enable a temperature value to be detected which corresponds particularly precisely to the temperature of the heating element and thus of the mirror element, without affecting the ability of the heating element to heat the mirror element. Generally, in a technically advantageous embodiment of the microelectromechanical apparatus, for each of the one or more microelectromechanical devices, the at least one temperature sensor and/or the heating element is an electrical resistance.

Preferably, for each of the one or more microelectromechanical devices, the heating element is arranged between the respective mirror element and the respective actuator or is part of the respective mirror element. Such arrangements of the heating elements generally have the advantage that the microelectromechanical devices can be designed to be particularly compact. Furthermore, a surface connection of the mirror to the heating element can be achieved in this way in order to achieve a targeted and homogeneous introduction of heat generated by the heating element. Heat losses can be minimized by the targeted introduction of the heat.

In a particularly preferred configuration of the microelectromechanical apparatus, each of the one or more mirror elements further comprises a Bragg mirror. Such a Bragg mirror comprises an alternating sequence of layers having different refractive indices, which results in the radiation reflected at the interfaces of the layers interfering constructively at a suitable wavelength of incident electromagnetic radiation and suitable thicknesses of the layers. Such Bragg mirrors are particularly suitable for use in projection exposure apparatuses for the production of microstructured or nanostructured components of microsystem or nanosystem technology.

In a technically advantageous embodiment of the microelectromechanical apparatus, the electronic system is configured to control the heating power of each of the heating elements of the one or more microelectromechanical devices in a closed-loop based on the temperature value of the mirror element of the respective microelectromechanical device. The temperature values of the one or more microelectromechanical devices, for example, can be kept constant thereby, despite fluctuating ambient temperatures and/or a fluctuating intensity of incident illumination radiation, for example.

It is also advantageous if the microelectromechanical apparatus comprises a further temperature sensor, and the electronic system is configured to determine a temperature value for a component of the microelectromechanical apparatus which is not a mirror element using the further temperature sensor. In this case, for example, the component may be an electronic system, for example a control electronic system for controlling the actuators, for example having an ASIC (application-specific integrated circuit). In particular, such a temperature sensor makes it possible to monitor heating of this component in an operating state. This makes it possible to more accurately predict a future temperature profile for each mirror element and to counteract heating of the respective mirror element, for example, by way of a lower heating power of the corresponding heating element.

According to a second aspect of the invention, an illumination optical unit for a projection exposure apparatus for guiding illumination radiation to an object field, comprising one or more microelectromechanical apparatuses according to the invention, is proposed.

According to a third aspect, an illumination system for a projection exposure apparatus comprising an illumination optical unit according to claim 8 and a radiation source, in particular an EUV radiation source (EUV: extreme ultraviolet), for the emission of illumination radiation is proposed, wherein illumination radiation emitted from the radiation source is reflected by a mirror element of the microelectromechanical apparatus.

According to a fourth aspect, a microlithographic projection exposure apparatus comprising an illumination optical unit according to the invention and a projection optical unit for projecting a reticle, arranged in the object field of the illumination optical unit, onto a wafer, arranged in an image field of the projection optical unit, is proposed.

An illumination optical unit according to the invention, an illumination system according to the invention and a projection exposure apparatus according to the invention may be part of an EUV lithography apparatus. For these, adjustable optical paths up to a photomask (also referred to as a reticle), which can be realized by a micromirror array with a plurality of mirror elements as a microelectromechanical apparatus according to the invention in the optical path, are advantageous. The mirror elements may include in this case in particular Bragg mirrors, which reflect the central wavelengths of the illumination radiation used particularly well.

For further details regarding the general design of a corresponding projection exposure apparatus and an associated illumination optical unit and an associated illumination system, reference is made to DE 10 2015 204 874 A1 and DE 10 2016 213 026 A1, which are hereby fully incorporated in the present application as part thereof.

According to a fifth aspect of the invention, a method for controlling temperatures of a microelectromechanical apparatus in a closed-loop is proposed, wherein the microelectromechanical apparatus comprises an electronic system, one or more temperature sensors and one or more microelectromechanical devices, each having a mirror element and a heating element for heating the respective mirror element. The microelectromechanical apparatus is preferably a microelectromechanical apparatus according to the present invention. The electronic system controls, for each of the one or more microelectromechanical devices, a temperature value, determined by way of the electronic system using the one or more temperature sensors, for the respective mirror element in a closed-loop by adjusting a heating power of the respective heating element to a respectively specified set temperature value. It is therefore a control loop. Determining the temperature value may include here detecting and evaluating an individual signal from an individual temperature sensor by signal evaluation, but also combining a plurality of signals from a plurality of temperature sensors by calculation.

Further parameters and data, in particular calibration data, can also be taken into account when determining a temperature value.

Furthermore, an adjustment of a respective heating power for the heating element of each of the one or more microelectromechanical devices is carried out depending on the respective specific temperature value and the respective specified set temperature value by the electronic system.

In particular, continuous linear controllers are suitable for such closed-loop control. Such closed-loop control can continue until a given condition has been met. By means of the method according to the invention, the temperatures of the mirror elements can be kept substantially constant and thus deformations and/or shifts of the mirror elements caused by temperature changes can be reduced or even completely avoided.

In a preferred embodiment of the method, each of the mirror elements is irradiated with illumination radiation from a radiation source, in particular an EUV radiation source, for example a plasma source, with a change in the intensity of the illumination radiation and/or activation and/or deactivation of the radiation source taking place. For example, the mirror elements are heated by increasing the intensity of the illumination radiation of the radiation source used to irradiate the mirror elements. Such heating can be counteracted by reducing a heating power of the heating elements within the scope of the closed-loop control. In the case of closed-loop control, the heating power of the heating elements is therefore preferably maximal during non-irradiation by the illumination radiation. Particularly preferably, the set temperature values of the mirror elements are selected for the closed-loop control in such a way that for each expected intensity value of the illumination radiation, the heat introduced by the illumination radiation can be compensated for by a reduction in the heating power of the respective heating element.

In a preferred embodiment of the method, the closed-loop control of the temperature values of the mirror elements to the set temperature values is carried out taking into account a further temperature value, determined by the electronic system by means of a further temperature sensor, for a further component of the microelectromechanical apparatus. In this way, further heat sources in addition to the illumination radiation can be taken into account in the closed-loop control in a targeted manner. For example, a further temperature value for a control electronic system for controlling actuators of the microelectromechanical apparatus can be ascertained in order to be able to predict heating of the microelectromechanical elements when this control electronic system is heated and to be able to compensate for it early.

ADVANTAGES OF THE INVENTION

The invention has various advantages. In particular, it allows to counteract temperature-related unwanted shifts and/or deformations, for example elongations and/or curvatures, of mirror elements in microelectromechanical apparatuses, which can occur in particular when an irradiating illuminating radiation source varies its intensity. It is possible to maintain desired constant temperatures of the mirror elements even in the case of fluctuating temperatures. This enables in particular calibration of the microelectromechanical apparatus and of an optical system such as a projection exposure apparatus for an intended operating temperature to which the temperature in the form of set temperature values for the mirror elements can be controlled. The precision of the microelectromechanical apparatus, in particular with regard to the reflection of incident illumination radiation, is significantly increased. This enables, for example, particularly precise illumination of a photomask in a microlithographic projection exposure apparatus.

A targeted adjustment of an individual, i.e. mirror-related, heating power further enables compensation for manufacturing-related differences between the mirror elements, for example fluctuations in radii of curvature of the reflecting surfaces.

In particular, if Bragg mirrors are to be used for the mirror elements of a micromirror array, constant temperatures of the mirror elements are required, since the layer system of the Bragg mirrors can lead to curvatures of the mirror elements at temperatures of the mirror elements that deviate from an intended operating temperature due to different expansion coefficients of the materials used. Such curvature defects caused by the Bragg layer or other coatings of the mirror elements can be reduced by an apparatus according to the invention.

Furthermore, a constant temperature of the mirror elements also results in a higher mechanical stability, as possible damage such as material fatigue is counteracted by continuous heating and cooling. This makes it possible to make the mirror elements thinner, which in turn allows for greater design flexibility. For example, actuators used to move the mirror elements need to exert less force and a corresponding mechanism needs to transmit less force, which allows for a more space-saving design of these elements.

The invention may in particular be used to keep the mirror elements at a temperature corresponding to an intended operating temperature even when the illumination radiation source of a projection exposure apparatus is temporarily completely deactivated, in order to avoid longer restart times until the operating temperature is reached. This enables more time-efficient workflows when irradiating a multiplicity of wafers.

BRIEF DESCRIPTION OF THE DRAWINGS

Embodiments of the invention are explained in more detail with reference to the drawings and the following description.

In the figures.

EMBODIMENTS OF THE INVENTION

In the following description of the embodiments of the invention, identical or similar elements are designated with the same reference signs, a repeated description of these elements in individual cases being omitted. The figures only schematically illustrate the subject matter of the invention.

Figure 1:
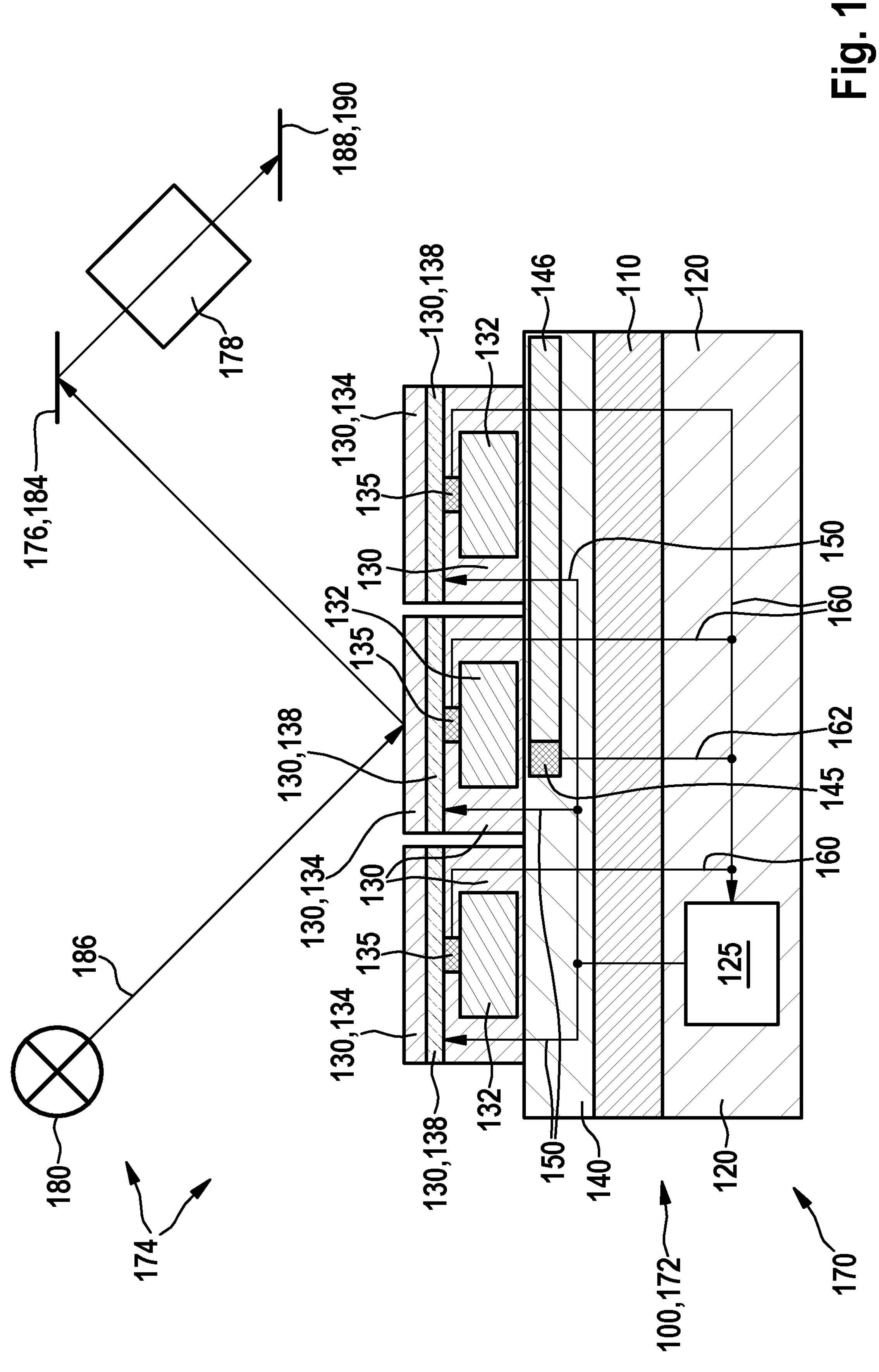
FIG. 1 shows a schematic illustration of a projection exposure apparatus according to the invention.

FIG. 1 shows a schematic illustration of an exemplary projection exposure apparatus 170 according to the invention, as can be used for example for EUV lithography. The projection exposure apparatus comprises an irradiation source 180, for example for EUV radiation, a reticle (photomask) 184, a projection optical unit 178 and a microelectromechanical apparatus 100 according to the invention. Furthermore, a wafer 190 is shown, which is intended for irradiation.

The microelectromechanical apparatus 100 has three microelectromechanical devices 130 with mirror elements 134 in the example shown. These microelectromechanical devices 130 each comprise a heating element 138 for heating the respective mirror element 134. The mirror elements 134 can be moved by means of actuators 132. A temperature sensor 135 arranged between the heating element 138 and the actuator 132 of the microelectromechanical device 130 enables determination of a temperature value of the mirror element 134. The microelectromechanical devices are applied to a layer 140, which can have one or more electronic components 146 such as ASICs, for example, for controlling the actuators 132. A temperature value is also determined for these electronic components 146. This is done via a further temperature sensor 145. The microelectromechanical devices 130 may be attached, together with the layer 140, to a mechanically stabilizing carrier substrate 110, for example consisting of a ceramic. Further electronic components, such as, for example, further ASICS, may be arranged below this carrier substrate 110. FIG. 1 further shows a layer 120 with an electronic system 125, for example implemented by means of an ASIC, which is configured to determine a temperature value of the respective mirror element 134 for each mirror element 134 using the temperature sensors 135. To this end, the temperature signals from the temperature sensors are transmitted to the electronic system 125 via the connections 160. In addition, the electronic system 125 is configured to adjust a heating power of each of the three heating elements 138. Corresponding control signals are transmitted from the electronic system 125 to the heating elements 138 by means of the connections 150. To determine the temperature value for one of the three mirror elements 134, signals from further temperature sensors 135 can additionally also be used, but also information such as calibration data and data regarding the environment of the microelectromechanical apparatus 100 and also signals from further temperature sensors 145 can be used. The electronic system 125 can further be configured to perform closed-loop control of the heating power of the heating elements 135 on the basis of the determined temperature values.

In the example shown, a temperature value for an electronic component 146, for example an ASIC, is further also determined by means of a further temperature sensor 145, wherein this electronic component 146 is used, for example, to control the actuators 132 of the microelectromechanical devices 130. Since an electronic component 146 likewise generates a relevant waste heat and thus contributes to the heating of the mirror elements, it is advantageous to determine a temperature value for this electronic component 146 by means of the temperature sensor by way of the electronic system 125 and to take it into account for closed-loop control. For this purpose, a corresponding temperature signal is transmitted to the electronic system 125 by means of the connection 162.

In the case of the exemplary projection exposure apparatus 170 shown, illumination radiation 186, for example EUV radiation, is emitted by a radiation source 180. This radiation travels from the radiation source 180 via the mirror elements 134 of the microelectromechanical apparatus 100 to the reticle 184 and from there to the wafer 190 by means of a projection optical unit 178. In this case, the reticle 184 is located in an object field 176 of the projection optical unit 178 and is projected from there by means of the projection optical unit 178 onto the wafer 178, which is located in an image field 188 of the projection optical unit 178. The projection exposure apparatus 170 and in particular the projection optical unit 178 are shown in FIG. 1 in a very simplified and purely schematic manner. For example, mirrors not shown in FIG. 1 can thus be used for beam guidance and beam shaping; in particular, the projection optical unit 178 may comprise a plurality of mirrors.

The mirror elements 134 heat up during operation due to absorption of the EUV radiation and due to the waste heat of the electronic component 146. In this case, the heating during the irradiation of a wafer 190 by means of the EUV radiation is typically not constant but fluctuating, since in the course of a typical irradiation process, the intensities of the illumination radiation 186 vary and/or they are partially completely deactivated. The temperature should also be kept as constant as possible between irradiation processes in order to avoid longer start-up times for the projection exposure apparatus 170. The aim here is to maintain the mirror elements 134 at a constant operating temperature by controlling the heating power of the heating elements 138 optimal for the operation of the projection exposure apparatus 170 in a closed-loop, meaning that errors, for example due to temperature changes of curving mirrors are minimized during the irradiation of the wafer 190.

Figure 2:
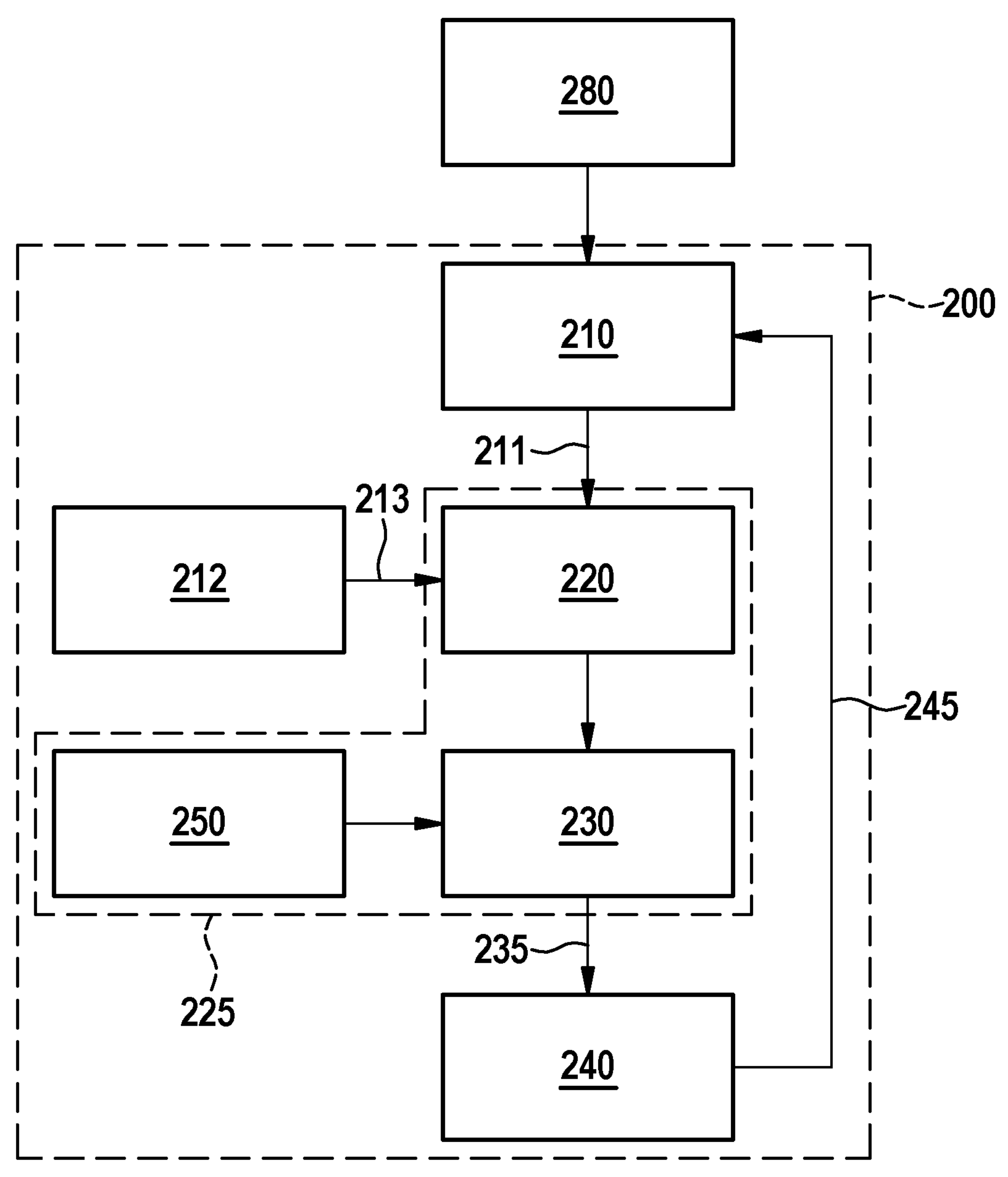
FIG. 2 shows a schematic flowchart for explaining a method according to the invention for controlling temperatures of a microelectromechanical apparatus in a closed-loop.

FIG. 2 shows a schematic flowchart for explaining an exemplary method according to the invention for controlling temperatures of a microelectromechanical apparatus 200 in a closed-loop, wherein the microelectromechanical apparatus 200 comprises an electronic system 225, one or more temperature sensors 210 and one or more microelectromechanical devices 130, each having a mirror element 134, an actuator 132 for moving the respective mirror element 134, and a heating element 240 for heating the respective mirror element 134. Set temperature values 250 are provided for each of the mirror elements 134 of the one or more microelectromechanical devices 130. These can be stored, for example, in a memory of the electronic system 225. These set temperature values 250 can correspond to intended operating temperatures of the mirror elements 134, i.e. to the temperatures at which the mirror elements 134 have the desired optical properties, that is to say in particular at which the mirror elements 134 deflect incident illumination radiation 186 of a defined wavelength as desired.

For the respective mirror element 134 of each of the one or more microelectromechanical devices 130, a determination 220 of a temperature value takes place using at least one of the one or more temperature sensors 210 by way of the electronic system 225. For this purpose, temperature signals 211 from the one or more temperature sensors 210 are transmitted to the electronic system 225, wherein each temperature sensor 210 can be assigned exactly to one mirror element 134. Subsequently, an adjustment 230 of a respective heating power for the heating element 240 of each of the one or more microelectromechanical devices 130 is carried out in dependence on the temperature value determined for the respective mirror element 134 and on the respective specified set temperature value 250 by way of the electronic system 225 by means of transmitting corresponding control signals 235 from the electronic system 225 to the heating elements 240. These steps of determining 220 and adjusting 230 can be repeated as often as desired, wherein the mirror elements 134 and thus the temperature sensors 210 are heated by the heating elements 240 (arrow 245), thus a change in the heating power affects the temperature values for the mirror elements 134. This means that the set temperature values 250 are controlled in a closed-loop. This closed-loop control can also be carried out taking into account a temperature value for a further component 146 of the microelectromechanical apparatus 200, which value is evaluated by means of a further temperature sensor 212 by way of the electronic system 125. For this purpose, a temperature signal 213 from the further temperature sensor 212 is transmitted to the electronic system 225.

Independently of this, irradiation 280 of each of the mirror elements 134 with the temperature sensors 210 can be carried out by means of illumination radiation 186 from a radiation source 180, wherein the intensity of the illumination radiation 186 can change over time, that is to say in particular also the radiation source 180 can be activated and/or deactivated. The closed-loop control of the temperature values via the heating elements 240 to the set temperature values 250 ensures that, despite the changing intensity of the illumination radiation 186, the temperatures of the mirror elements 134 are kept constant and unwanted deformations and/or shifts of the mirror elements 134 are counteracted.

The invention is not limited to the exemplary embodiments described here and to the aspects highlighted therein. On the contrary, a large number of modifications that are within the ability of a person skilled in the art are possible within the scope specified by the claims.

The invention claimed is:

1. A microelectromechanical apparatus comprising one or more microelectromechanical devices each having a mirror element, an actuator for moving the respective mirror element, and a heating element for heating the respective mirror element, wherein the microelectromechanical apparatus comprises one or more temperature sensors and an electronic system, wherein the electronic system is configured to determine a temperature value of the respective mirror element using the one or more temperature sensors for each mirror element, and the electronic system is furthermore configured to adjust a heating power for each of the heating elements, wherein for each of the one or more microelectromechanical devices the heating element is arranged between the respective mirror element and the respective actuator, wherein each of the one or more mirror elements comprises a Bragg mirror.

2. The microelectromechanical apparatus according to claim 1, wherein each of the one or more microelectromechanical devices has at least one of the one or more temperature sensors.

3. The microelectromechanical apparatus according to claim 2, wherein for each of the one or more microelectromechanical devices a. the at least one temperature sensor is arranged between the respective actuator and the respective heating element; or b. the respective heating element comprises or is identical to the at least one temperature sensor.

4. The microelectromechanical apparatus according to claim 1, wherein for each of the one or more microelectromechanical devices the at least one temperature sensor and/or the heating element is an electrical resistor.

5. The microelectromechanical apparatus according to claim 1, wherein for each of the one or more microelectromechanical devices the heating element is part of the respective mirror element.

6. The microelectromechanical apparatus according to claim 1, wherein the electronic system is configured for controlling the heating power of each of the heating elements of the one or more microelectromechanical devices in a closed-loop based on the temperature value of the mirror element of the respective microelectromechanical device.

7. The microelectromechanical apparatus according to claim 1, wherein the microelectromechanical apparatus comprises a further temperature sensor, and the electronic system is configured to determine a temperature value for a component of the microelectromechanical apparatus which is not a mirror element, for example for an electronic component, using the further temperature sensor.

8. An illumination optical unit for a projection exposure apparatus for guiding illumination radiation to an object field, comprising one or more microelectromechanical apparatuses according to claim 1.

9. An illumination system for a projection exposure apparatus, comprising an illumination optical unit according to claim 8 and a radiation source, in particular an EUV radiation source, for emitting illumination radiation, wherein illumination radiation emitted from the radiation source is reflected by a mirror element of the microelectromechanical apparatus.

10. A microlithographic projection exposure apparatus comprising an illumination optical unit according to claim 8 and a projection optical unit for projecting a reticle, arranged in the object field of the illumination optical unit, onto a wafer, arranged in an image field of the projection optical unit.

11. A method for controlling temperatures of a microelectromechanical apparatus in a closed-loop, wherein the microelectromechanical apparatus has an electronic system, one or more temperature sensors and one or more microelectromechanical devices, each having a mirror element and a heating element for heating the respective mirror element, wherein the electronic system controls, for each of the one or more microelectromechanical devices, a temperature value, determined by way of the electronic system, for the respective mirror element using the one or more temperature sensors in a closed-loop by adjusting a heating power of the respective heating element to a respectively specified set temperature value, wherein the one or more microelectromechanical devices each further comprise an actuator for moving the respective mirror element, wherein for each of the one or more microelectromechanical devices the heating element is arranged between the respective mirror element and the respective actuator, wherein each of the one or more mirror elements comprises a Bragg mirror.

12. The method according to claim 11, wherein, during the closed-loop control of the temperature values to the set temperature values of the mirror elements, irradiation at least of one of the mirror elements with illumination radiation from a radiation source, in particular an EUV radiation source, takes place and the intensity of the illumination radiation is changed one or more times, wherein the set temperature values of the one or more mirror elements remain unchanged here.

13. The method according to claim 11, wherein the closed-loop control of the temperature values of the mirror elements to the set temperature values is carried out taking into account a further temperature value, determined by way of the electronic system by means of a further temperature sensor, for a further component of the microelectromechanical apparatus.

* * * * *